(12) United States Patent
Wells et al.

(10) Patent No.: US 6,982,549 B1
(45) Date of Patent: Jan. 3, 2006

(54) MICRO-ELECTROMETER

(76) Inventors: Thomas Jay Wells, 5036 N. Albany Ave., Chicago, IL (US) 60625; Robert Scott Elliott, 14544 S. State Rd. 39, Hanna, IN (US) 46340

( * ) Notice: Subject to any disclaimer, the term of this patent is extended or adjusted under 35 U.S.C. 154(b) by 0 days.

(21) Appl. No.: 10/750,588

(22) Filed: Dec. 31, 2003

(51) Int. Cl.
*G01R 29/12* (2006.01)
(52) U.S. Cl. .......................... 324/72; 43/17.1; 250/382
(58) Field of Classification Search ................. 324/72, 324/457, 119, 123 R; 119/220; 340/852; 250/384
See application file for complete search history.

(56) References Cited

U.S. PATENT DOCUMENTS

| | | | | |
|---|---|---|---|---|
| 1,622,786 A | * | 3/1927 | Horle | 324/123 R |
| 2,501,769 A | * | 3/1950 | Frommer | 324/119 |
| 2,927,269 A | | 3/1960 | Ecker | 324/72 |
| 3,449,668 A | | 6/1969 | Blackwell | 250/324 |
| 4,950,978 A | | 8/1990 | Govaert | 324/72 |
| 5,311,694 A | | 5/1994 | Sharber | 43/17.1 |
| 5,445,111 A | | 8/1995 | Smith | 119/220 |

OTHER PUBLICATIONS

H.S. Anker, Stabilized D-C Amplifier with High Sensitivity originally published in ELECTRONICS, Jun. issue, 1947 p. 138 Reprinted in Handbook of Industrial Electronic Circuits, by Mc Graw-Hill Book Company, Inc. copyright 1948 p. 71 published in the USA. New York, NY, no month available.
W.A. Hayes, RH-507 Inverted Triode, originally published in Radio News (Radio-Electronic Engineering Edition) Jan. 1945 also reprinted in Handbook of Industrial Electronic Circuits, by Mc Graw-Hill Book Company, Inc. copyright 1948 p. 104 published in the USA. New York, NY, no month available.
Harry Mileaf, Electronics Three, 1976, p. 34, published by Hayden Book Company, Inc. Published in the USA , no month available ISBN 0-8104-5956-6.
F.E Terman, Radio Engineering, copyright 1937, pp. 134-139 and pp. 148, 149. Published by Mc Graw-Hill Book Company, Inc. published in the USA, no month available.
Gordon J. Deboo and Clifford N. Hurrous, Integrated Circuits and Semiconductor Devices: Theory and Application, copyright 1977, p. 57. published in the USA by Mc Graw-Hill , Inc, no month available.
Jacob Millman and Christos C. Halkias, Integrated Electronics: Analog and Digital Circuits and Systems, copyright 1972. Published in the USA by Mc Graw-Hill Inc. p. 327, no month available.

* cited by examiner

Primary Examiner—Vincent Q. Nguyen
(74) Attorney, Agent, or Firm—Mathew R. P. Perrone, Jr.

(57) ABSTRACT

A voltmeter for measuring atmospheric or other voltages eliminates the dead band without application of high voltages or radioactive isotopes to increase conductivity in the region of the probe. A vacuum tube is operated at substantially reduced conduction in order to achieve high sensitivity and eliminate passive components in the input circuit. A voltage is developed to produce meter indication or control charging or charge-neutralizing circuits. In the preferred embodiment, a meter scale is calibrated to indicate the presence of atmospheric charges of particular interest to anglers. Naturally occurring electrical currents are known to stimulate the feeding of fish.

9 Claims, 1 Drawing Sheet

MICRO-ELECTROMETER

CROSS REFERENCE TO RELATED APPLICATIONS

Not applicable.

STATEMENT REGARDING FEDERALLY SPONSORED RESEARCH OR DEVELOPMENT

Not applicable.

REFERENCE TO SEQUENCE LISTING, A TABLE OR A COMPUTER PROGRAM LISTING COMPACT DISK APPENDIX

Not applicable.

BACKGROUND—FIELD OF INVENTION

This invention relates to non-contact voltmeters, and to the indication of atmospheric charges due to earth-air currents, as currents of an electrical nature in bodies of water will also be impressed upon any organisms, i.e. fish, in the water, and electrical stimulus of these organisms will result.

BACKGROUND—DESCRIPTION OF PRIOR ART

The total of earth-air currents worldwide is accepted to be in the range of 1800 amps. These currents maintain the existence of earth's electrostatic field, which varies from 100 to 1500 volts per meter near the earth's surface. Atmospheric charges and currents vary locally, and are influenced by cloud heights, moisture content, thunderstorms, jet streams, wind, ionization due to solar radiation, conductivity of the location's soil or water, and natural or man-made topography or structures. These currents will also be expressed in the earth's uppermost surface, and seek paths of least resistance. These may be natural or man-made paths not limited to metallic buried bodies such as pipelines, ore deposits, soils rich in ionic chemistry, and any body of water in conductive contact with the earth's surface.

Naturally occurring electrical currents are greatest in the vicinity of thunderstorm activity, and certain levels of current peripheral to these storms are associated with air inflowing to updrafts, which results in strong winds and gusts depositing insects into the water, and association may be made between these conditions and the feeding of fish.

A British patent of 1863 recognized electrofishing, in which fish are attracted to an anode conducting a direct current. Electrical stimulus of fish in their natural environment is recognized in U.S. Pat. No. 5,445,111 (1995) to Smith, in which fish avoid a barrier presented by an electrical current impressed in the water.

Non-contacting voltmeters are used in many applications to non-intrusively measure electrostatic charges between bodies or surfaces. The prior art has employed various methods to provide sufficient sensitivity to measure small charges. The earlier devices used vacuum tubes, as exemplified by Ecker et al, U.S. Pat. No. 2,927,269 (1960). This voltage-measuring device requires ionization of the air at the probe by radium, which provides sufficient conductivity to complete a circuit through which enough current will flow to the ground to permit meter indication. Ecker's device uses one of two possible input resistances, in parallel with the control element, either of which were considered necessary in design, in which electrons collecting at the grid could leak off to ground. Without a return path to ground for electrons, tube conduction stops as the grid becomes more and more negative. This is true when tubes are operated at normal accepted cathode temperatures and plate voltages. The current through a tube is then so great, that a grid leak resistor is necessary to make the tube and circuit stable, which decreases input sensitivity in that it provides a leakage path to ground for the desired signal. The voltage developed across the grid leak, applied to the control element, is not the same voltage existing at the probe, but a representation of the voltage derived as a result of current flow through the resistance. Ecker's device also uses a filament cathode, in which the electrons are emitted directly by a glowing wire, and undesirable current variations in the filament circuit will deflect meter indication as readily as a desired signal. Other devices, such as L L Blackwell et al, U.S. Pat. No. 3,449,668 (1969), use a radioactive ionizing element, and two directly heated vacuum tubes arranged in a bridge circuit, but do not reduce cathode temperature to secure higher sensitivity or use a circuit providing voltage amplification. Later non-contact voltmeters use an input circuit based on a Field-Effect transistor (FET), often a metal-oxide silicon type (MOSFET), in which the gate of the device capacitively couples the signal of interest through a layer of silicon dioxide 1000 angstroms thick. This thin layer is easily ruptured by as little as 100 volts, and typically is protected by one or more zener diodes in parallel with the gate, either integrally in manufacture, or incorporated into the circuit design. This degrades the input of the MOSFET in several ways: the leakage current is greater, and the input resistance is less, because there is a diode across the input. Leakage currents of 10 sub-10 amps and input resistances of 10 sup 11 ohms are typical for diode gate protected MOSFETs. Unprotected MOSFETs are unsuited to direct application of atmospheric potentials due to the likelihood of gate rupture from electrical discharges. Another disadvantage of the MOSFET is that it does not introduce the input signal directly into the stream of current to be modulated, but relies upon opposing charges developed through a capacitor formed by the silicon dioxide layer. These charges, a representation of the input signal, modify current-carrier mobility within a conduction channel. This capacitance introduces a 90-degree phase shift in any AC signal, and isolates a DC signal. Typically, an n-channel depletion type MOSFET is used in order to permit sensing voltage which may be negative or positive. This type of FET has a nominally conductive channel of n-type material between its drain and source. Since the current in a FET is due to the majority carriers (electrons for an n-type material), introducing a negative voltage to the gate induces positive charges into the conduction channel, which reduces the availability of majority carriers, decreasing conductivity. Such capacitive coupling is avoided in a vacuum tube; the actual input signal may be introduced upon a conductive path to a point directly within the current to be modulated.

Voltmeters using solid state input devices suffer from an effect referred to as "dead band." This is a range between a small negative voltage, through a zero-voltage point, to a small positive voltage, within which input current flow to a measuring device is insufficient to distinguish it from internal leakage currents due to input protection or leakage of the measuring device itself. In Govaert, U.S. Pat. No. 4,950,978 (1990) conductivity of the air in the vicinity of the probe is increased by application of high voltage AC coupled to the probe. This creates ion pairs providing enough conductivity for a current to flow, sufficient to be measured by the sensing electronics. The applied high voltage AC, corona discharge, and recombining ions and electrons create a large AC component, which must be filtered before the DC component can be isolated. This design also uses a resistance in parallel with the input, decreasing the sensitivity, and making the input voltage an analog, rather than the actual input signal. Other electrostatic voltmeters apply a high-frequency modulation to a capacitance between the metering apparatus and the test surface to be measured.

The disadvantages in this method are that as the modulation frequency is increased, smaller samples are collected for measurement. Low voltages become increasingly hard to measure since they induce little current into a sampling capacitance. The resultant sample is a quantized charge, a function of the capacitance and the stability of the modulation and the frequency used. Such a sample is derivative, not the actual input signal. This method is also somewhat intrusive as the modulating frequency imposed into a subject may result in rectification, resulting in a change of a DC level to be measured.

SUMMARY OF THE INVENTION

The invention consists of a non-contact voltmeter providing a very high input impedance, permitting atmospheric or other voltage potentials to directly control conduction of an electron tube, with operating voltages specifically limiting tube conduction to a low level, permitting the tube to achieve equilibrium with no grid current return path except that provided by the subject or environment to be measured.

OBJECTS AND ADVANTAGES

It is the object of the present invention to provide an accurate, durable, sensitive non-contact voltmeter for measurement of low voltages, particularly adjusted in this embodiment to advise anglers to the presence of charges and currents known to stimulate fish. A further object of the invention is to simplify the equipment needed to measure voltages non-intrusively, by eliminating formerly required application of bias voltages, AC frequencies or ionization in the probe vicinity, or derivation of input voltages across passive components.

Another object is to provide a voltmeter useful in real-time measurement and control.

The first advantage of the invention is the use of reduced cathode emission and tube conduction, which reduces the number of electrons collected by the control grid, making it possible to eliminate the grid leak resistor. This allows the actual test potential to influence the current flow in the tube. It also allows the tube to create a self-bias, eliminating any need for user calibration.

The second advantage of the invention is the elimination of capacitances between the sensor and the control element, providing true DC coupling, so that the actual potential to be measured is introduced upon the control element, rather than an analog of it.

The third advantage of the invention is the use of an indirectly heated cathode, with the result that minor current variations in the filament do not translate readily into deflection of the meter.

A fourth advantage of the invention is the durability of a vacuum tube, which is not subject to damage at low voltages, and not needing input protection, is not subject to reduced sensitivity caused by leakage currents in protection devices.

A fifth advantage of the invention is the conduction of the potential to be measured directly to a point within the current flow to be controlled, rather than influencing the flow of current from a point adjacent, as a Field Effect Transistor does.

A sixth advantage of the invention is the elimination of any need to increase conductivity in the vicinity of the probe by radioactive means or high voltage corona discharge means, whether balanced or offset, and the need for filter circuits to extract the desired signal from an AC voltage created by such means.

A seventh advantage is the elimination of any need to derive a measurement from quantized samples, or make tradeoffs between speed of measurement and the size of the samples. This makes real-time measurement or control of a process possible.

An eighth advantage of the invention is the freedom of electron mobility within the vacuum tube compared to the relative immobility of electrons in a semiconductor, within which electrons must migrate along specific paths in a crystalline structure.

A ninth advantage of the invention is the adaptability of the circuit, in that adjustment of the various electrode voltages easily permit the meter to indicate a different range of voltage which may be of interest in a specific application, where the meter may be calibrated in current, any related microvolt relationship, or replaced by a load resistor to develop a control voltage for process or environment control purposes.

A tenth advantage is the use of a vacuum tube with five grids, arranged as a space-charge tube, with the control grid shielded electrostatically from the cathode and plate. This makes input capacity very small permitting a circuit arrangement providing voltage gain.

The increased operator safety, simplicity and other advantages particularly realized by this voltmeter arrangement will become apparent from a consideration of the drawings and ensuing description.

Figure 1:
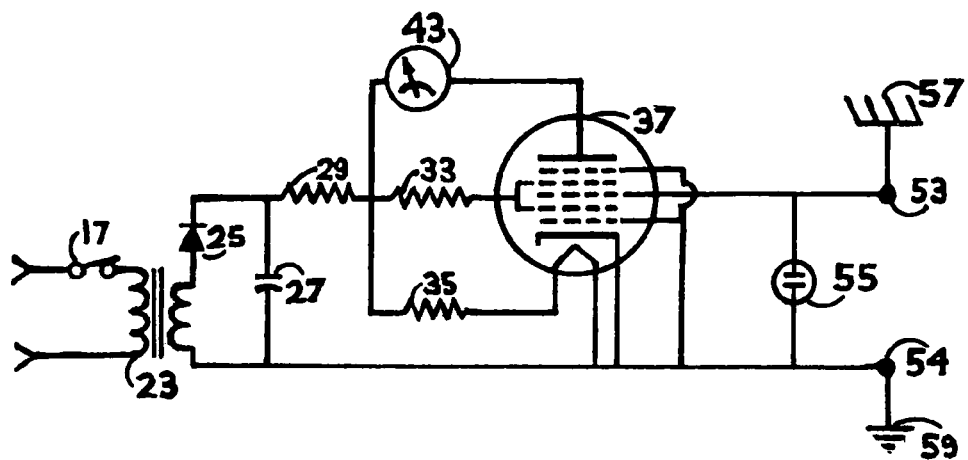
FIG. 1 is a circuit diagram of an embodiment of the invention arranged for AC operation.

LIST OF REFERENCE NUMERALS with PART DESIGNATIONS

| | |
|---|---|
| 17 | switch SPST |
| 23 | transformer 44 v. AC secondary |
| 24 | heater battery 2–1.5 v. D alkaline cells |
| 25 | rectifier 1N4004 silicon rectifier |
| 26 | plate battery 4–9 v. alkaline batteries |
| 27 | electrolytic capacitor 100 mfd. 50 v. |
| 29 | voltage dropping resistor 100 ohms 2 watt |
| 33 | screen resistor 2200 ohms, ¼ watt |
| 35 | heater resistor 200 ohms 4 watt |
| 37 | tube 12BE6 (in socket) |
| 37' | tube 3BE6 or 6BE6 (in socket) |
| 43 | meter 1 ma./full scale |
| 53 | input terminal (on terminal strip) |
| 54 | ground terminal (on terminal strip) |
| 55 | neon bulb |
| 57 | antenna |
| 59 | earth ground |

DESCRIPTION OF THE INVENTION

FIG. 1 shows a schematic diagram of an embodiment of the invention intended for continuous operation with a power supply arranged to operate from standard alternating current. Referring to FIG. 1, an antenna 57, which may be a wire or a more elaborate structure at its remote end, is placed as high as practicable, arranged and mounted in a way as to provide electrical insulation from mounting structures that may be grounded. This antenna is connected by insulated wire to an input terminal 53, one of two connections on a terminal strip. An earth ground 59 is connected by insulated wire to a ground terminal 54, adjacent to input terminal 53. Terminals 53 and 54 are the only external wiring connections. All connections to a tube 37 are terminated through a standard plug-in tube socket (not shown). Tube 37 may be any tube type which may be operated as a space-charge tube. Input terminal 53 is connected by wire to the third grid of tube 37, and to one side of a neon bulb 55. Terminal 54 is connected by wire to six points as internal ground: the other side of neon bulb 55, the secondary of a transformer 23, the negative terminal of an electrolytic capacitor 27, the negative heater terminal of tube 37, the cathode and fifth grid terminal of tube 37, and the first grid terminal of tube 37. A switch 17 is connected in series with the primary winding of transformer 23, to the appropriate AC voltage to be applied as power source. The other end of the primary winding connects to the applied AC power source.

Figure 2:
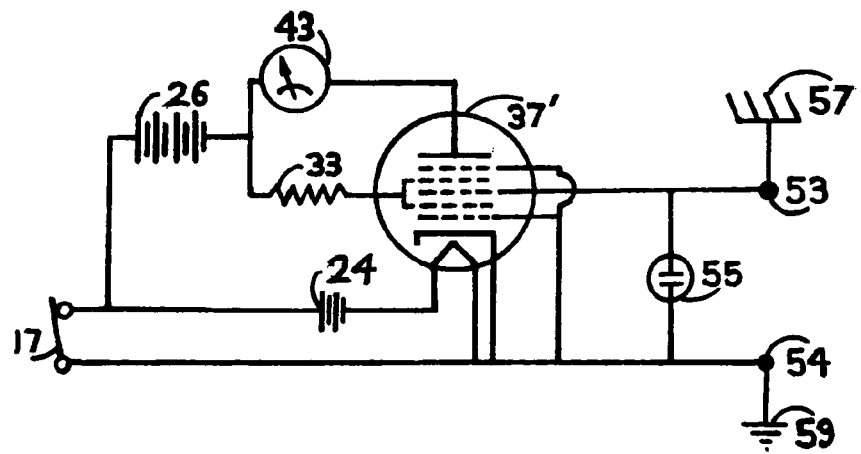
FIG. 2 is a circuit diagram of an embodiment of the invention arranged for battery operation.

The secondary winding of transformer 23 is connected to the internal ground wiring, and to the cathode of a rectifier 25. The anode of rectifier 25 is connected to the positive terminal of electrolytic capacitor 27. A voltage-dropping resistor 29 is connected at one end to the positive terminal of electrolytic capacitor 27, at the other end, to three points: a meter 43, a screen resistor 33, and a heater resistor 35. The other terminal of meter 43 connects to the plate terminal of tube 37. Screen resistor 33 connects to the screen grid (second and fourth grids) terminal of tube 37. Heater resistor 35 connects to the positive heater terminal of tube 37. FIG. 2 shows a schematic diagram of an embodiment of the invention arranged for intermittent portable operation from batteries.

Referring to FIG. 2, an antenna 57, which may be a wire or a more elaborate structure at its remote end, is placed as high as practicable, arranged and mounted in a way as to provide electrical insulation from structures that may be grounded. In an outdoor situation this may be a whip-type antenna attached to the device itself rather than remote or elevated. The selected antenna is connected to an input terminal 53, directly in the case of the whip antenna, or by insulated wire in the other. Input terminal 53 is one of two connections on a terminal strip. An earth ground 59 is connected by insulated wire to a ground terminal 54, adjacent to input terminal 53. These terminals 53 and 54 are the only external connections. All connections to a tube 37' are through a plug-in tube socket (not shown). Tube 37' may be any tube type which may be operated as a space-charge tube, with particular consideration given to reduced power consumption and matching commonly available battery types. Terminal 53 is connected by wire to the third grid terminal of tube 37', and to one side of a neon bulb 55. Terminal 54 is connected by wire to 5 points as an internal ground: the other side of the neon bulb 55, the negative heater terminal of tube 37', the cathode and fifth grid terminal of tube 37', the first grid terminal of tube 37', and one side of a switch 17. The other side of switch 17 connects to two points: the negative terminal of a heater battery 24, and the negative terminal of a plate battery 26. The positive terminal of heater battery 24 is connected to the positive heater terminal of tube 37'. The positive terminal of a plate battery 26 is connected to two points: a meter 43, and a screen resistor 33. Meter 43 connects to the plate terminal of tube 37'. Screen resistor 33 connects to the screen grid (second and fourth grids) terminal of tube 37'.

OPERATION OF THE INVENTION

In usual practice, the voltages applied to a vacuum tube, while permitting use in high-impedance circuits, still permit too much grid current to flow to allow atmospheric potentials to control the conduction of a tube. In this invention, both heater and plate voltages are kept to such low levels as to permit only a very low level of conduction, such that the flow of electrons in the tube is readily controlled by the charge introduced upon the third grid by the antenna. Control grid current is not eliminated by this operating condition, but reduced to a level that atmospheric currents provide the return path for these electrons in the control grid circuit. The selection of tube type 12BE6 is based upon its low inter-electrode capacities, high transconductance and amplification factor.

Referring to FIG. 1, switch 17 is closed to provide AC voltage to the primary winding of transformer 23. The secondary winding of the transformer is connected to rectifier 25 and electrolytic capacitor 27 forming a half wave rectifier power supply with a loaded output of 48 volts DC.

Voltage dropping resistor 29 develops a 13 volt potential in operation. Voltage dropping resistor 29 is part of a voltage divider in series with heater resistor 35 setting the voltage to be applied to the heater of tube 37 to 9 volts. Voltage dropping resistor 29 is also in series with screen resistor 33, setting the voltage to be applied to the second and fourth grids to 27 volts. Voltage dropping resistor 29 is also in series with meter 43, and the voltage applied to plate of tube 37 is 35 volts. These voltages applied to tube 37 result in a low emission of electrons from the cathode, and low current from cathode to plate. The voltage to be measured at antenna 57 is applied to input terminal 53, which is connected to the third grid of the tube.

The earth ground 59 is the reference signal to which a sample voltage is compared, and is connected to terminal 54. Neon bulb 55 is not necessary for protection of the circuit or tube but as with any device attached to an elevated antenna, is provided as a lightning arrestor. This neon bulb will ionize and conduct at a level of approximately 100 volts. During normal operation, the neon gas is not ionized, and does not provide a leakage path for electrons in the grid to antenna circuit. The electrons emitted by the indirectly heated cathode are attracted to the positively charged plate of the tube. In traveling to the plate they must pass through five concentrically arranged grids. The first and fifth of these grids are at ground potential, and electrons collecting upon them return to ground. The second and fourth grids are connected by screen resistor 33 and voltage dropping resistor 29 to positive potential, and electrons collecting upon them flow to the positive potential at the anode of rectifier 25. As electrons flow from cathode to plate, and collect on the five grids, a negative charge accumulates on the third grid, and a space charge develops about this control grid, reducing the current from cathode to plate. This accumulated charge is insufficient to cut off current completely, which will achieve a low steady state. Meter 43 connected between voltage dropping resistor 29 and the plate of tube 37 will deflect a small amount, reflecting the small current flowing. Depending on the voltage applied between terminals 53 and 54, three distinct conditions along a continuum may be indicated. In the case that electrons are neither collected by nor emitted from the antenna, an equilibrium state established by the tube operating point will result, with a small but definite meter deflection. This is also the case with no antenna connected. When the voltage present at the antenna is negative, electrons collect upon the antenna, and being conducted to the third grid of tube 37, the increasing negative charge on the grid reduces the current through the tube, decreasing plate current, and deflecting the meter needle to a point lower than that indicated by the equilibrium state. In the case of a positive voltage at the antenna, electrons will be emitted by the antenna, supplied by the conducting wire from the third (control) grid of the tube, continuously replenished by the space charge within the vacuum tube. These electrons return to the cathode and negative side of the power supply through the atmosphere and earth. Under these conditions, plate current increases and the meter needle deflects in a pronounced way to a position higher than that indicated in the equilibrium state. This last condition is characteristic of the environment presented in the vicinity of weather conditions creating currents in the earth's surface associated with winds likely to deposit insects on the surface of lakes, rivers and streams.

Referring to FIG. 2, switch 17 is closed to complete the circuits energized by heater battery 24 and plate battery 26. This applies 3 volts to the heater of tube 37', 36 volts to the plate of tube 37' through meter 43, and 27 volts to the second and fourth grids of tube 37' through screen resistor 33.

These batteries provide substantially the same potentials provided by the half wave power supply and voltage divider network in the embodiment described for alternating current operation, and establish the same low conduction level for the tube.

All other aspects of operation are exactly as described for the embodiment operated by alternating current.

Description of Alternative Embodiments

The primary element of the invention is tube 37 or 37', operating at a very low level of conduction. This condition is created by applying a heater voltage of approximately 71% of that normally specified for the tube type. The resulting low cathode temperature, combined with relatively low plate voltage, permits elimination of a grid resistor, providing many useful possibilities. Further decrease of cathode temperatures may provide an even greater sensitivity, but as conduction becomes lower, additional stages of voltage amplification become necessary to develop a usable control voltage in the plate circuit. At the 71% level specified, a circuit with only one tube is sensitive enough to develop a useful control voltage across a load resistor or meter. Higher heater voltages increase cathode temperatures, and begin to create conditions in which a grid leak resistor would be necessary to prevent the control grid from developing a negative charge which would cut off tube conduction, thus decreasing sensitivity in a non-contact application. This could be desirable in a situation where a high-voltage environment is to be measured, as in the case of an electrostatically charged drum in a photocopy machine. Any power supply arranged to provide the level of conduction as needed for a particular non-contact application could be used, with consideration of these issues.

An alternative embodiment might include a voltage comparator or simple switch to enable a visual or audible alarm indication at a user-selected level.

Other embodiments might incorporate tube 37 or 37', with other elements replaced by different power supplies and/or input signal arrangement. The voltages applied to plate, screen and heater may be lower or higher in order to permit indication of a different range of voltage. The polarity of signals applied between terminals 53 and 54 determines the direction of meter deflection. Replacing screen resistor 33 with a potentiometer will permit the zero-voltage point to be calibrated to mid-scale on the meter, or any desired position, allowing for an offset scale of either negative or positive. Particular applications will dictate whether terminal 53 should connect to positive or negative potential relative to terminal 54.

Embodied in an electrostatic photocopy machine application, the potentials for plate, screen, and heater voltages might be easily provided from other internal DC supplies. The input terminal and ground terminal would be replaced by connections to a probe near the field to be measured, and an internal ground point. Meter 43 would be replaced by a load resistor, across which a voltage would be developed, to be used to control the charging of the electrostatic drum.

Another embodiment might apply tube 37 or 37' to derive a control voltage output to balance charges developed in semiconductor manufacturing equipment and facilities, to reduce the incidence of failed devices in manufacturing and assembly.

Systems that balance accumulated charges on aircraft might apply tube 37 or 37' to derive a control voltage for charge balancing.

Another embodiment might employ tube 37 or 37' as a means for developing a control voltage to apply charges to powder handling equipment to improve flows of materials, reduce dust and the likelihood of explosions from electrical discharges.

Tube 37 or 37' could be easily applied to measure a specific environment in a burglar alarm. With adaptation the circuit would also be useful in contact applications, such a pH/ion meter. Another contact-type application embodiment would employ tube 37 or 37' in a circuit with the input contacting two materials generating a work potential, as in a thermocouple junction, or measuring work potentials in a laboratory situation.

What is claimed is:

1. A non-contact voltmeter comprising:
   a source of power;
   a transformer engaged to the power source;
   an on/off switch engaged between the power source and transformer;
   a terminal strip;
   an antenna engaged to an input terminal of the terminal strip;
   an earth around engaged to a ground terminal of the terminal strip;
   a space charge tube comprising a plurality of grids and a plate;
   the input terminal of the terminal strip being engaged to one grid of the tube;
   a meter engaged to the plate of the space charge tube;
   a gas discharge tube engaged to an input of the tube;
   the tube at substantially reduced cathode temperature and electron emission, whereby voltages or other related quantities or qualities are measured in real time using only the naturally occurring voltage and conductivity present as a grid control source.

2. The voltage of claim 1 wherein the tube is operated at substantially reduced cathode temperature and electron emission the sole direct current path for electron communication between the control grid and the return side of the circuit being provided by the subject to be measured.

3. The voltmeter of claim 1 wherein the tube is operated at substantially reduced cathode temperature and electron emission, utilizing only the conductivity of the subject to be measured to provide the grid control source, said circuit components being arranged to develop a voltage for indication by a meter.

4. The voltmeter of claim 1 further including a heater resistor connected to a heater of the space charge tube.

5. The voltmeter of claim 1 further including a screen resistor connected to the grid of the space charge tube.

6. The voltmeter of claim 1 further including a voltage dropping resistor connected to the screen resistor and the heater resistor of the space charge tube.

7. The voltmeter of claim 1 wherein the source of power is an alternating current.

8. The voltmeter of claim 1 wherein the source of power is a direct current.

9. The voltmeter of claim 1 wherein the gas discharge tube is a neon tube.

\* \* \* \* \*

UNITED STATES PATENT AND TRADEMARK OFFICE
CERTIFICATE OF CORRECTION

PATENT NO. : 6,982,549 B1  Page 1 of 1
DATED : January 3, 2006
INVENTOR(S) : Thomas J. Wells and Scott Elliott It is certified that error appears in the above-identified patent and that said Letters Patent is hereby corrected as shown below:

<u>Title page,</u>
Item [56], References Cited, OTHER PUBLICATIONS, "F.E. Terma" reference, delete "Hurrous" and insert -- Burrous --.

<u>Column 2,</u>
Line 33, delete "sub" and insert -- sup --.

<u>Column 9,</u>
Line 1, delete "voltage" and insert -- voltmeter --.

Signed and Sealed this

Twenty-eighth Day of March, 2006

JON W. DUDAS
*Director of the United States Patent and Trademark Office*